(12) United States Patent
Wood, II et al.

(10) Patent No.: US 7,723,704 B2
(45) Date of Patent: May 25, 2010

(54) EUV PELLICLE WITH INCREASED EUV LIGHT TRANSMITTANCE

(75) Inventors: Obert Reeves Wood, II, New York, NY (US); Ryoung-Han Kim, San Jose, CA (US); Thomas Wallow, San Carlos, CA (US)

(73) Assignee: Globalfoundries Inc., Grand Cayman (KY)

( * ) Notice: Subject to any disclaimer, the term of this patent is extended or adjusted under 35 U.S.C. 154(b) by 820 days.

(21) Appl. No.: 11/595,085

(22) Filed: Nov. 10, 2006

(65) Prior Publication Data

US 2008/0113491 A1    May 15, 2008

(51) Int. Cl.
*G03F 1/00* (2006.01)
(52) U.S. Cl. .......................... 250/492.2; 430/5; 428/14
(58) Field of Classification Search .................. None
See application file for complete search history.

(56) References Cited

U.S. PATENT DOCUMENTS

| | | | |
|---|---|---|---|
| 6,197,454 B1 | 3/2001 | Yan et al. | |
| 6,623,893 B1 | 9/2003 | Lyons | |
| 7,153,615 B2 * | 12/2006 | Bristol et al. | 430/5 |
| 2005/0026045 A1 | 2/2005 | Roux | |
| 2005/0040345 A1 | 2/2005 | Bakker et al. | |
| 2005/0042153 A1 | 2/2005 | Bristol | |
| 2008/0152873 A1 * | 6/2008 | Okoroanyanwu et al. | 428/195.1 |

FOREIGN PATENT DOCUMENTS

| | | |
|---|---|---|
| EP | 0482821 | 4/1992 |
| JP | 04/009060 | 1/1992 |

OTHER PUBLICATIONS

"Aerogel", Wikipedia, http://en.wikipedia.org/wiki/Aerogel (last modified Aug. 16, 2006).
John E. Bjorkholm, "EUV Lithography—The Successor to Optical Lithography?", Intel Technology Journal, vol. Q3 (1998), pp. 1-8.
Lloyd C. Litt, et al., "EUV Lithography without Pellicles: Working without a Net", Future Fab International, Issue 14, Section 5, Feb. 11, 2003.
"Aerogel", NASA Jet Propulstion Laboratory, http://stardust.jpl.nasa.gov/tech/aerogel.html (last modified Mar. 31, 2005).

* cited by examiner

*Primary Examiner*—Jack I Berman
(74) *Attorney, Agent, or Firm*—Farjami & Farjami LLP

(57) ABSTRACT

According to one exemplary embodiment, an extreme ultraviolet (EUV) pellicle for protecting a lithographic mask includes an aerogel film. The pellicle further includes a frame for mounting the aerogel film over the lithographic mask. The aerogel film causes the pellicle to have increased EUV light transmittance.

15 Claims, 3 Drawing Sheets

EUV PELLICLE WITH INCREASED EUV LIGHT TRANSMITTANCE

TECHNICAL FIELD

The present invention is generally in the field of fabrication of semiconductor devices. More particularly, the invention is in the field of lithographic patterning of semiconductor wafers.

BACKGROUND ART

During semiconductor wafer fabrication, extreme ultraviolet (EUV) light can be utilized in a lithographic process to enable transfer of very small patterns, such as nanometer-scale patterns, from a mask to the semiconductor wafer. In EUV lithography, a pattern formed on a lithographic mask can be transferred to a semiconductor wafer by reflecting EUV light off of portions of a reflective surface from which an absorbing film has been selectively removed. A pellicle can be placed in front of the mask to prevent unwanted particles from reaching the mask surface and, thereby, altering the pattern formed on the mask. However, since EUV light is highly absorbed by all known materials, placing a reticle in front of the mask can significantly reduce EUV light transmittance, which can undesirably reduce throughput of an EUV lithography exposure tool.

In one approach, a lithographic mask is kept in a box having a lid that is closed to protect the mask from particle contamination. After the lithographic mask has been inserted into the EUV lithography exposure tool, the lid on the box can be opened in the vacuum chamber of the exposure tool just before using the mask. After use, the lid on the box can be quickly closed to protect the mask. However, in this approach, the lithographic mask can be contaminated by particles that are generated as a result of materials rubbing when the lid is opened or closed.

SUMMARY

An EUV pellicle with increased EUV light transmittance, substantially as shown in and/or described in connection with at least one of the figures, as set forth more completely in the claims.

DETAILED DESCRIPTION OF THE INVENTION

The present invention is directed to an EUV pellicle with increased EUV light transmittance. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
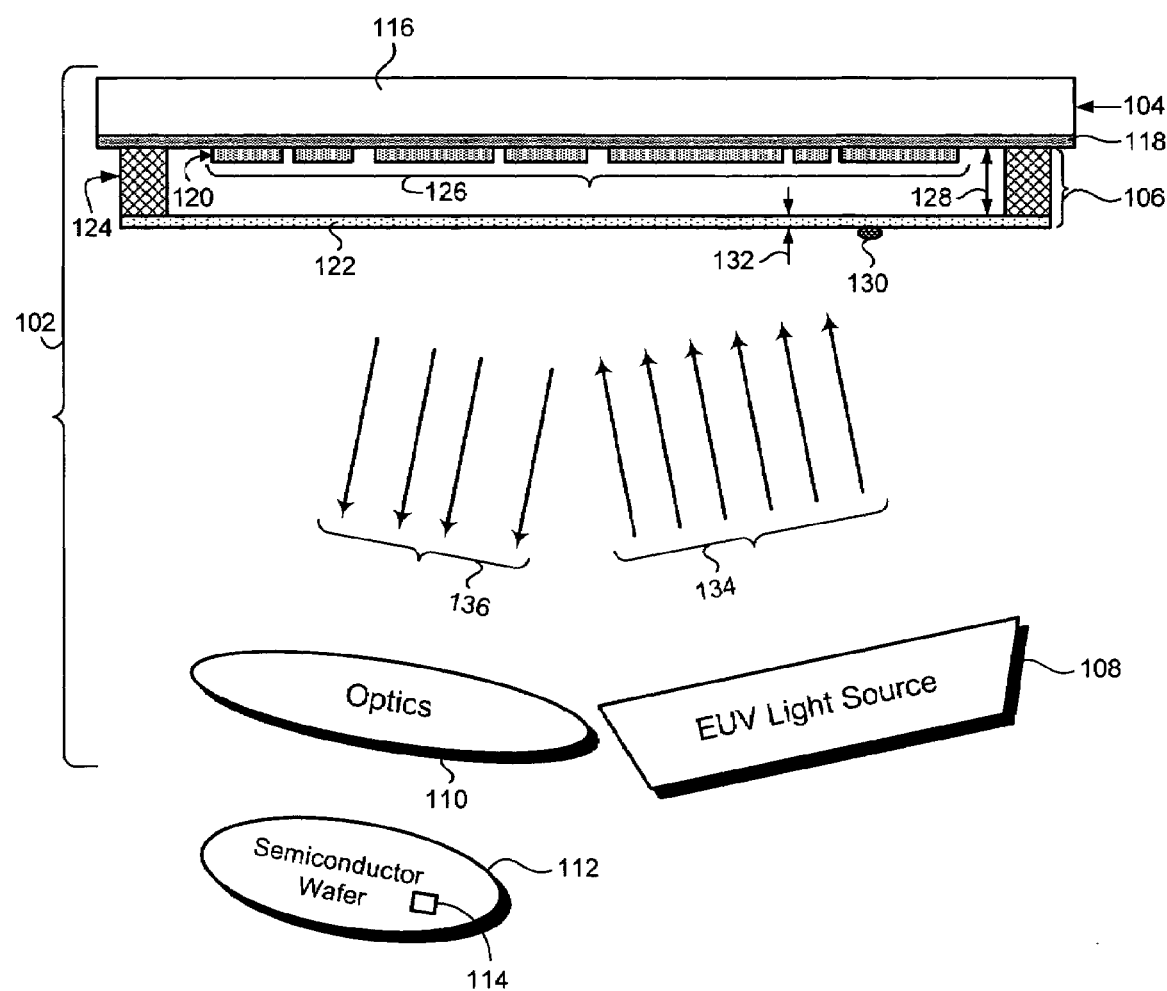
FIG. 1 illustrates a diagram of an exemplary EUV lithographic system including an exemplary EUV pellicle attached to an exemplary lithographic mask in accordance with one embodiment of the present invention.

FIG. 1 shows a diagram of an exemplary EUV (extreme ultraviolet) lithographic system including an exemplary EUV pellicle attached to an exemplary lithographic mask in operation with an exemplary semiconductor wafer in accordance with one embodiment of the present invention. In FIG. 1, EUV lithographic system 102 includes lithographic mask 104, EUV pellicle 106, EUV light source 108, and optics 110 and is in operation with semiconductor wafer 112, which includes semiconductor die 114. Lithographic mask 104, which is an EUV reflective mask, includes substrate 116, reflective film 118, and absorbent film 120 and EUV pellicle 106 includes aerogel film 122 and frame 124. EUV lithographic system 102 can be utilized to transfer a pattern on lithographic mask 104 to semiconductor wafer 112 in a lithographic process in an EUV lithography exposure tool during wafer fabrication.

As shown in FIG. 1, reflective film 118 is situated over substrate 116 and can comprise a multilayer film for reflecting EUV light. For example, reflective film 118 can comprise a number of alternating layers of molybdenum and silicon. Substrate 116 can comprise fused silica or other suitable material having a low thermal expansion co-efficient and can have a thickness equal to approximately ¼ inch, for example. Also shown in FIG. 1, absorbent film 120 is situated over reflective film 118 and includes pattern 126. Absorbent film 120 can comprise a suitable EUV absorbing material as known in the art. Pattern 126, which can be lithographically transferred to semiconductor wafer 112 by reflective EUV light, can be formed by selectively removing portions of absorbing film 120 to expose corresponding portions of reflective film 118. During lithographic processing of semiconductor wafer 112, only EUV light that strikes exposed portions of reflective film 118 is reflected and directed to semiconductor wafer 112 by optics 110.

Further shown in FIG. 1, frame 124 is attached to lithographic mask 104 and can comprise metal or other suitable material. Frame 124 has thickness 128, which can be between 0.5 centimeter (cm) and 1.0 cm, for example. Frame 124 can be attached to lithographic mask 104 by glue, for example, or other suitable type of fastener. Also shown in FIG. 1, aerogel film 122 is mounted on frame 124 and situated over lithographic mask 104. In addition to mounting aerogel film 122, frame 124 causes aerogel film 122 to be situated at a distance of between 0.5 cm and 1.0 cm above pattern 126, which is formed on the surface of lithographic mask 104.

Aerogel film 122 provides protection to lithographic mask 104 by preventing particles, such as particle 130, from contacting lithographic mask 104 and, thereby, undesirably altering pattern 126 on the surface of the mask. Aerogel film 122 can protect lithographic mask 104 from particles with diameters larger than 10.0 nanometers, for example. Aerogel film 122 also keeps particles, such as particle 130, at a sufficient distance from pattern 126 to prevent the particles from being printed on semiconductor wafer 112 during the lithographic printing process by ensuring that the particles are kept at a distance that is larger than the depth-of-focus of the imaging optics 110. Aerogel film 122 has a very high EUV light transmittance and can comprise an "aerogel" form of a material, such as silicon.

"Aerogels" are a class of open-celled mesoporous solid materials that typically comprise between 90.0% and 99.8% air and have densities ranging between 1.1 milligrams (mg) per cubic centimeter ($cm^3$) and 150.0 $mg/cm^3$. In general, a material has its lowest density when the material is in an aerogel form. In an aerogel form, a material has a higher EUV transmission, i.e., lower EUV absorption loss, than any other form of that material. At a nanoscale perspective, an aerogel structurally resembles a sponge and is composed of a network of interconnected nanoparticles. An aerogel, due to the presence of Rayleigh scattering, has a transmission loss mechanism that a smooth solid film does not have. Rayleigh scattering is an optical phenomenon that takes place when white light scatters off of particles smaller than the wavelengths of light. Transmission loss due to Rayleigh scattering in an aerogel film can be minimized by reducing the size of the aerogel's nanopores. Porous silicon is particularly advantageous from this standpoint because of the ease with which it is possible to electrochemically tune the pore diameter in this material.

To achieve a very low density, aerogel film 122 comprises a material in an aerogel form. Also, to achieve an aerogel film having high EUV light transmittance, the material is selected for low EUV absorption. For example, aerogel film 122 can comprise a silicon aerogel, which comprises porous silicon. Silicon aerogel has a very low density of approximately 1.9 $mg/cm^3$ compared to the significantly higher density of 2.33 $g/cm^3$ for solid silicon. Silicon aerogel can be formed by electrochemical dissolution of silicon in a hydrogen fluoride (HF)-based solution, for example. In another embodiment, aerogel film 122 can comprise a material such as metal in an aerogel form, e.g., a metal foam aerogel. The metal foam aerogel can be formed by impregnating a hydrogel with a solution containing ions of a suitable noble or transition metal, such as ruthenium. The impregnated hydrogel can then be irradiated with gamma rays to cause precipitation of nanoparticles of the metal, thereby forming a metal foam. A metal foam comprising ruthenium has a very high oxidation resistance, which is particularly advantageous for an EUV pellicle.

Aerogel film 122 has thickness 132, which can be between approximately 1.0 micrometer and approximately 10.0 micrometers, for example. In one embodiment, aerogel film 122 can have a thickness of approximately 10.0 micrometers. At a thickness of approximately 10.0 micrometers, aerogel film 122 can transmit more than 97.0% of incident EUV light, which advantageously results in very little throughput loss in an EUV lithography exposure tool. Thickness 132 can be optimally selected to achieve an aerogel film having a balance between structural strength, particle stopping power, and EUV transmission. Thus, the invention's aerogel film can have a thickness that is thick enough to provide sufficient strength to allow the aerogel film to be utilized without a supporting mesh and to trap particles, such as particle 130, while being thin enough to provide sufficiently high EUV light transmittance.

Further shown in FIG. 1, EUV light source 108 is situated under EUV pellicle 106 and provides a source of EUV light for transferring pattern 126 on the surface of lithographic mask 104 to semiconductor wafer 112. Also shown in FIG. 1, incident EUV light 134 from EUV light source 108 passes through aerogel film 122 of EUV pellicle 106 and strikes the surface of lithographic mask 104. The portion of EUV light 134 that strikes a portion of reflective film 118 that is not covered by absorbing film 120 is reflected back through aerogel film 122 as reflected EUV light 136, which can pass through optics 110 and strike semiconductor wafer 112. In contrast, the portion of incident EUV light 134 that strikes absorbent film 120 is absorbed and, therefore, not reflected back through aerogel film 122. Thus, pattern 126 is transferred to, i.e. printed on, semiconductor wafer 112 by reflected EUV light 136, which is the portion of incident EUV light 134 that is reflected off of the patterned surface of lithographic mask 104.

Further shown in FIG. 1, optics 110 is situated between EUV pellicle 106 and semiconductor wafer 112 and is utilized to focus and direct reflected EUV light 136 to resist-coated semiconductor wafer 112 by utilizing an EUV lithographic printer in an EUV lithographic printing process. Further shown in FIG. 1, semiconductor die 114 is situated on semiconductor wafer 112 and is fabricated concurrently with semiconductor wafer 112. Semiconductor die 114 can be a microprocessor die, for example. However, semiconductor die 114 can also comprise a memory array or other types of integrated circuits known in the art. During wafer fabrication, pattern 126 is transferred to semiconductor die 114 as well as other semiconductor dies situated on semiconductor wafer 112, which are not shown in FIG. 1 to preserve brevity. Semiconductor die 114 can be separated from semiconductor wafer 112 in a dicing process after fabrication of semiconductor wafer 112 has been completed.

Thus, by utilizing an aerogel film in an EUV pellicle to protect a lithographic mask, the present invention effectively protects the lithographic mask from unwanted particles that can undesirably alter a pattern on the mask's surface. Also, by utilizing an aerogel film comprising a silicon aerogel, for example, the invention achieves an EUV pellicle having significantly increased EUV light transmittance compared to a conventional EUV pellicle. As a result, the invention also achieves an EUV pellicle that advantageously provides increased throughput of an EUV lithography exposure tool compared to a conventional pellicle.

Figure 2:
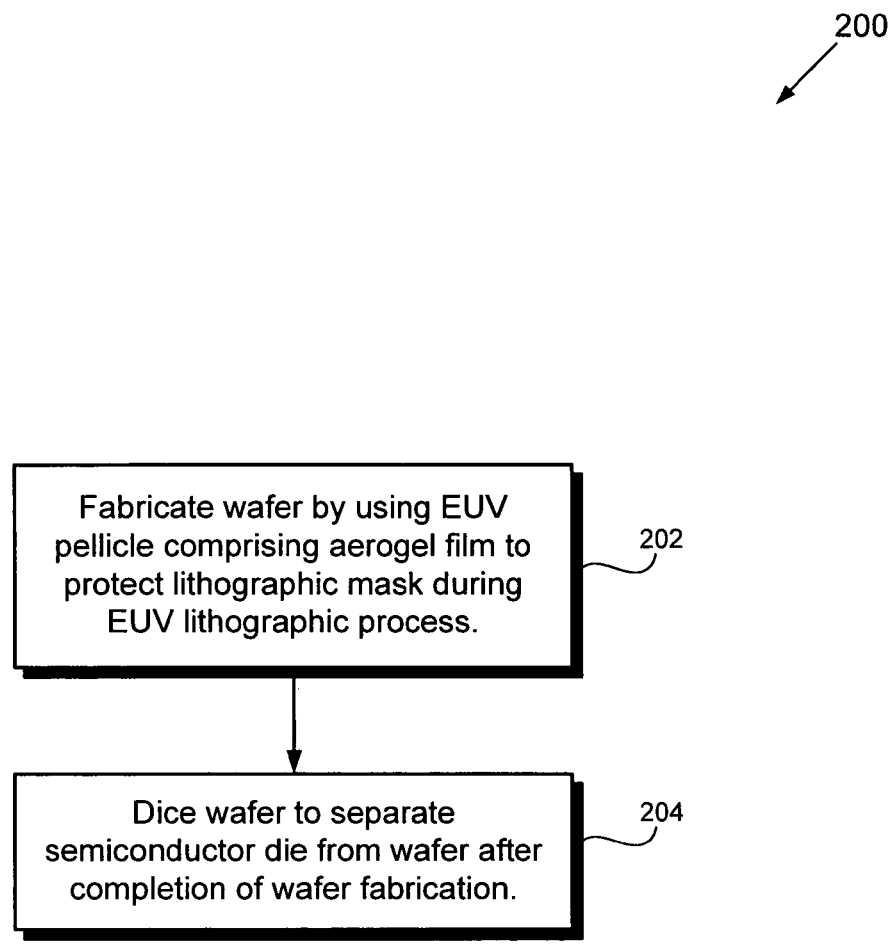
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art.

Referring now to step 202 of flowchart 200 in FIG. 2, semiconductor wafer 112 is fabricated by using EUV pellicle 106 comprising aerogel film 122 in FIG. 1 to protect lithographic mask 104 during an EUV lithographic process. During the EUV lithographic process, pattern 126 on lithographic mask 104 can be transferred to resist-coated semiconductor wafer 112 by using an EUV lithographic printer, which uses EUV light. Aerogel film 122 can comprise a silicon aerogel, which effective protects lithographic mask 104 from unwanted particles and provides significantly increased EUV light transmittance.

At step 204 of flowchart 200, semiconductor die 114 can be separated from semiconductor die 112 in a dicing process after wafer fabrication has been completed. Semiconductor die 114, which is fabricated by using the invention's EUV pellicle for protecting a lithographic mask in an EUV lithographic process, can be a microprocessor die, for example.

Figure 3:
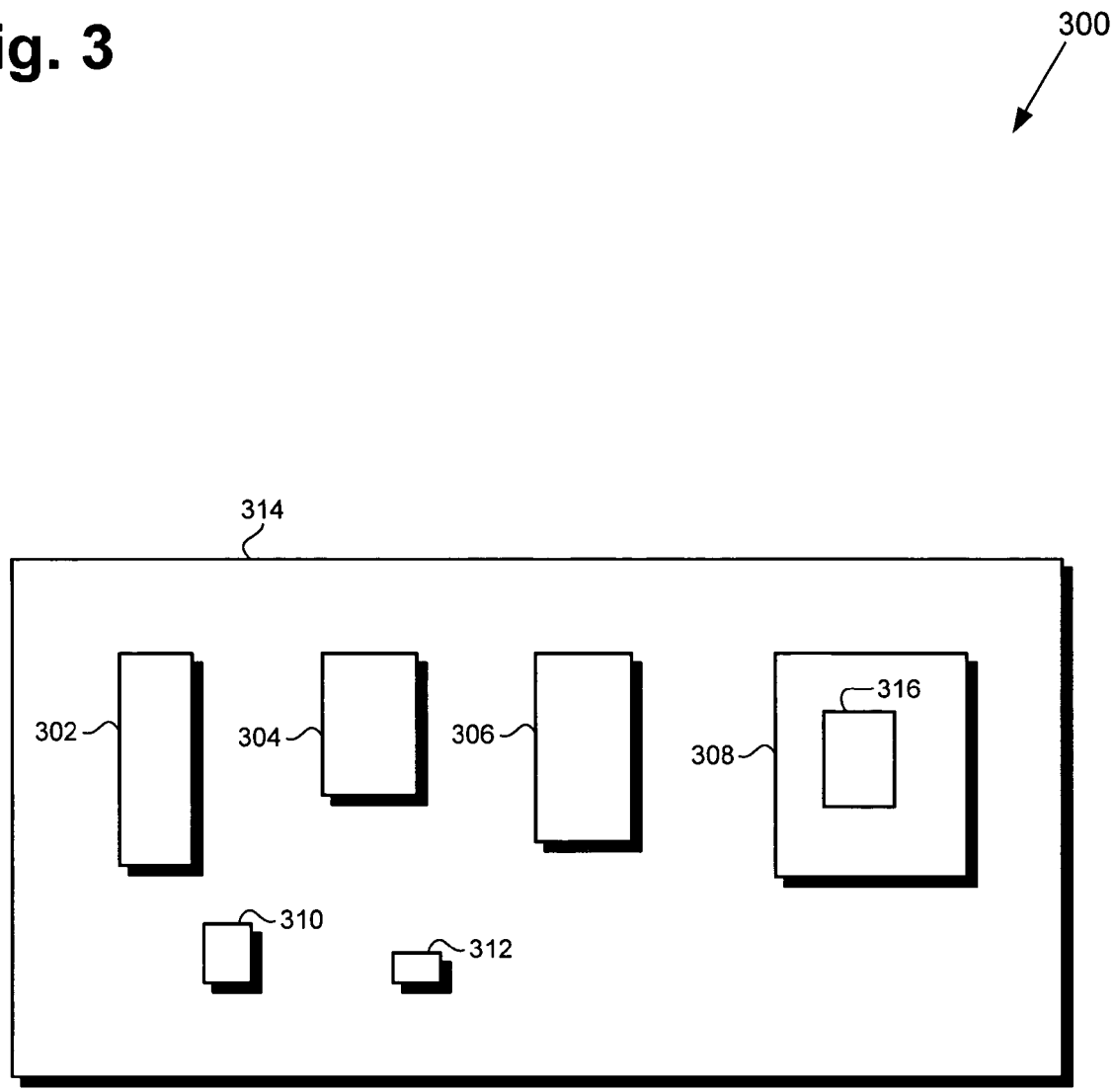
FIG. 3 illustrates a diagram of an exemplary electronic system including an exemplary chip or die fabricated by utilizing an EUV pellicle for protecting a lithographic mask in accordance with one embodiment of the present invention.

FIG. 3 illustrates a diagram of an exemplary electronic system including an exemplary chip or die fabricated by utilizing an EUV pellicle for protecting a lithographic mask in accordance with one embodiment of the present invention. Electronic system 300 includes exemplary modules 302, 304, and 306, IC chip 308, discrete components 310 and 312, residing in and interconnected through circuit board 314. In one embodiment, electronic system 300 may include more than one circuit board. IC chip 308 can comprise a semiconductor die, such as semiconductor die 114 in FIG. 1, which is fabricated by using an embodiment of the invention's EUV pellicle, such as EUV pellicle 106 in FIG. 1. IC chip 308 includes circuit 316, which can be a microprocessor, for example.

As shown in FIG. 3, modules 302, 304, and 306 are mounted on circuit board 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modem electronic circuit boards. Circuit board 314 can include a number of interconnect traces (not shown in FIG. 3) for interconnecting modules 302, 304, and 306, discrete components 310 and 312, and IC chip 308.

Also shown in FIG. 3, IC chip 308 is mounted on circuit board 314 and can comprise, for example, any semiconductor die that is fabricated by utilizing an embodiment of the invention's EUV pellicle. In one embodiment, IC chip 308 may not be mounted on circuit board 314, and may be interconnected with other modules on different circuit boards. Further shown in FIG. 3, discrete components 310 and 312 are mounted on circuit board 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 300 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modem electronics applications.

Thus, by utilizing an aerogel film comprising, for example, a silicon aerogel, in an EUV pellicle, the invention provides an EUV pellicle that effectively protects a lithographic mask from unwanted particles while advantageously providing significantly increased EUV light transmittance. By increasing EUV light transmittance, the invention's EUV pellicle advantageously increases EUV lithography exposure tool throughput during lithographic processing of a semiconductor wafer.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an EUV pellicle with increased EUV light transmittance has been described.

The invention claimed is:

1. An extreme ultraviolet (EUV) pellicle for protecting a lithographic mask, said pellicle comprising:
    an aerogel film;
    a frame for mounting said aerogel film over said lithographic mask;
    wherein said aerogel film causes said pellicle to have increased EUV light transmittance.

2. A semiconductor die fabricated by the EUV pellicle of claim 1.

3. The semiconductor die of claim 2, where said semiconductor die is a microprocessor die.

4. The EUV pellicle of claim 1, wherein said aerogel film comprises a material in an aerogel form, wherein said material is selected for low EUV absorption.

5. The EUV pellicle of claim 4, wherein said material comprises silicon.

6. The EUV pellicle of claim 4, wherein said material comprises a metal.

7. The EUV pellicle of claim 6, wherein said metal comprises ruthenium.

8. The EUV pellicle of claim 1, wherein said aerogel film transmits more than 97.0 percent of incident EUV light.

9. A method for fabricating a semiconductor die, said method comprising steps of:
    fabricating a wafer using an extreme ultraviolet (EUV) lithographic printer that utilizes a pellicle for protecting a lithographic mask, said pellicle comprising an aerogel film, a frame for mounting said aerogel film over said lithographic mask, wherein said aerogel film causes said pellicle to have increased EUV light transmittance;
    dicing said wafer to separate said semiconductor dies.

10. The method of claim 9, wherein a material in an aerogel form, wherein said material is selected for low EUV absorption.

11. The method of claim 10, wherein said material comprises silicon.

12. The method of claim 10, wherein said material comprises a metal.

13. The method of claim 12, wherein said metal comprises ruthenium.

14. The method of claim 9, wherein said aerogel film transmits more than 97.0 percent of incident EUV light.

15. The method of claim 9, wherein said semiconductor die is a microprocessor die.

* * * * *